United States Patent [19]

Nojima et al.

[11] Patent Number: 5,003,197

[45] Date of Patent: Mar. 26, 1991

[54] SUBSTRATE BIAS VOLTAGE GENERATING AND REGULATING APPARATUS

[75] Inventors: Isao Nojima, Sunnyvale; Ping Wang, Saratoga; Hung Q. Nguyen, San Jose, all of Calif.

[73] Assignee: Xicor, Inc., Milpitas, Calif.

[21] Appl. No.: 299,040

[22] Filed: Jan. 19, 1989

[51] Int. Cl.⁵ ..................... H03K 3/01; G06G 7/10
[52] U.S. Cl. ............................ 307/296.2; 307/491
[58] Field of Search ............... 307/296.2, 296.8, 491, 307/494

[56] References Cited

U.S. PATENT DOCUMENTS

| | | | |
|---|---|---|---|
| 4,142,114 | 2/1979 | Green | 307/296.6 |
| 4,356,412 | 10/1982 | Moench et al. | 307/296.1 |
| 4,388,537 | 6/1983 | Kanuma | 307/296.2 |
| 4,438,346 | 3/1984 | Chuang et al. | 307/304 |
| 4,439,692 | 3/1984 | Beekmans et al. | 307/296.6 |
| 4,471,290 | 9/1984 | Yamaguchi | 307/296.6 |
| 4,794,278 | 12/1988 | Vajdic | 307/351 |
| 4,825,142 | 4/1989 | Wang | 307/296.2 |
| 4,843,256 | 6/1989 | Scade et al. | 307/296.2 |

Primary Examiner—Stanley D. Miller
Assistant Examiner—Richard Roseen
Attorney, Agent, or Firm—McCubbrey, Bartels, Meyer & Ward

[57] ABSTRACT

An apparatus for generating and regulating a substrate bias voltage for use in semiconductor devices. The invention comprises a sensor which is responsive to the substrate bias voltage, and generates a continuously variable regulating voltage and a continuously variable oscillator bias voltage. A variable impedance device whose resistance is adjustable over a range of values as a function of said regulating voltage is coupled to a charge pump to control the amount of charge pumped by said charge pump per unit time from the substrate of the semiconductor device. An oscillator whose frequency is continuously controlled by the oscillator bias voltage from the sensor is coupled to said charge pump so as to further control the amount of charge pumped by said charge pump per unit time.

27 Claims, 7 Drawing Sheets

SUBSTRATE BIAS VOLTAGE GENERATING AND REGULATING APPARATUS

FIELD OF THE INVENTION

This invention relates to the field of integrated circuit bias voltage generation and regulation and more particularly to a bias voltage generator and regulator apparatus for use with integrated circuit electrically erasable programmable memory devices.

BACKGROUND OF THE INVENTION

Integrated circuit electrically erasable programmable read-only memory (EEPROM) devices are well-known memory devices used for non-volatile information storage.

In operation, EEPROM devices generate a number of signals having a variety of voltages One type of EEPROM device, referred to as a "thick oxide EEPROM", incorporates a three layer polysilicon structure as the individual bit memory element (called a "cell"). The three layers of polysilicon are separated from each other by a layer of oxide such that one polysilicon layer is electrically insulated from the other two. Information is retained in the form of an electric charge stored on this insulated layer, which is also called a "floating gate". To program the EEPROM, that is, to store information on the EEPROM, requires a relatively high voltage (e.g., approximately 25 volts) so that electrons may tunnel across the insulating oxide layer from the programming electrode to the floating gate. To erase information requires a voltage sufficient to force the electrons on the floating gate to tunnel across a second oxide layer to an erase electrode. These high voltages, however, may cause the individual memory cells to be no longer isolated from one another, as they must be in order to accurately store information.

A memory cell is no longer electrically isolated from adjacent cells whenever the voltage applied to the memory cell exceeds the field threshold of the field isolation thick oxide MOS (metal oxide semiconductor) transistors between cells The field threshold is the gate voltage at which these field isolation transistors turn on. When the field isolation MOSFET turns on, the associated EEPROM memory cell is no longer isolated from adjacent cells. It is known that the field threshold is strongly affected by the bias voltage applied to the substrate of the memory cell As an increasingly negative voltage is applied to the substrate, the field threshold increases. Specifically, in a typical thick oxide EEPROM device, the field threshold is approximately ten volts when the substrate bias voltage ($V_{BB}$) is zero volts. If the substrate bias is $-1$ volt, the field threshold rises to about 17 volts. Since thick oxide EEPROM cells require up to 25 volts for accurate programming, a substrate bias voltage of approximately $-3$ volts is required to maintain a field threshold above 25 volts in order to have fully independent non-volatile operation of adjacent cells.

In other words, programming an EEPROM requires approximately 25 volts. To ensure isolation of the individual memory cells requires that the programming voltage remain below the field threshold of parasitic transistors. Thus, the field threshold must be of the order of 25 volts and above. To raise the field threshold to that level requires a negative substrate bias voltage of approximately $-3$ volts. This substrate bias voltage must be maintained while generally minimizing current consumption.

Charge, however, may leak from the substrate through its p-n junctions with the other layers, causing $V_{BB}$ to change to a less negative value. Substrate leakage current is more significant with the larger die sizes of modern EEPROMs. Substrate leakage is also higher at high temperature at the high voltages required for EEPROM programming.

Further, whenever high voltage tunneling operations are performed on an EEPROM, the gates, sources, and drains of many transistors in the chip are taken to high voltages Since the gates of these transistors form the top electrode of gate oxide capacitors to the substrate, and the sources and drains form junction capacitors to the substrate, there is substantial capacitive coupling of these high voltages on the gates to the substrate. This results in significant variations in the substrate bias voltage which must be controlled in order to successfully program or erase the EEPROM cell.

Further, certain applications of integrated circuit devices must reliably withstand high ambient temperatures. For example, military specifications require high reliability at relatively higher temperatures.

A further desirable attribute of all electronic devices is low current consumption. Low current usage is particularly important where the devices are battery operated. In addition, the less current required, the smaller and lighter the power source may be. Thus, the minimization of current consumption by the EEPROMs will help to maximize their usefulness. One method of minimizing current is to maintain a low standby current just sufficient to maintain the substrate bias voltage until the next active operation.

There are two approaches taken in the prior art to address the problem of substrate bias voltage leakage.

One prior art approach is to utilize two charge pumps to provide charge to create the substrate voltage. The first pump is a high-frequency, fast charge pump for the active mode of programming or erasing. The second pump is a low-frequency, slow charge pump for the standby mode where the chip is inactive, but the substrate bias voltage must still be maintained. The disadvantages of the two-pump system are that (1) the slow pump tends to consume more current than is needed at the normally low temperatures of the standby mode, thus exacerbating the current consumption problem, and (2) the slow pump is inefficient and, at worst, too weak to maintain the substrate bias voltage at higher temperatures which may exist just after an active to standby transition occurs. Thus the two-pump system is inefficient in that it requires more current than necessary in standby mode and may not be able to supply enough charge at higher temperatures.

Another prior art approach to maintaining the substrate bias voltage is to use a sensor to monitor the $V_{BB}$ level and turn an oscillator on and off which turns a charge pump on and off as needed to maintain the substrate bias voltage. This system, however, may cause the substrate bias voltage to oscillate in a sawtooth wave fashion. This is because of the lag (hysteresis) of the sensor in its response and the possible overshooting of the pump when turning off. The sawtooth oscillation of the substrate bias voltage creates problems in maintaining the field threshold voltage, thereby presenting problems in isolating the memory cells. The sawtooth oscillation also causes additional noise problems in the circuits because many circuits are capacitively coupled to the substrate bias voltage.

Accordingly, it is an object of the present invention to provide a means for generating and regulating a stable substrate bias voltage for EEPROM and other integrated circuit devices.

It is a further object of the present invention to maintain the stable bias voltage of EEPROM devices at high operating temperatures and during active-to-standby transitions.

It is another object of the present invention to provide a substrate bias voltage generating and regulating circuit which minimizes current consumption.

It is yet another object of the present invention to provide a substrate bias voltage generating and regulating circuit which is a self-contained unit conveniently applicable to existing integrated circuit EEPROMs and other devices.

It is still another object of the present invention to provide a substrate bias voltage generating and regulating circuit which is capable of supplying the substrate current necessary to maintain the desired substrate bias voltage at the relatively high ambient temperatures required to meet military specifications and which also does not consume excessive current at the relatively low ambient temperatures which are also required to meet military specifications.

These and other objects of the present invention will become obvious to those skilled in the art from the following detailed description of the invention and the accompanying drawings.

SUMMARY OF THE INVENTION

The present invention is an improved bias voltage generator and regulator apparatus for generating and regulating a substrate bias voltage for use in integrated circuit semiconductor devices. The invention comprises a charge pump coupled to the substrate of the semiconductor device and means for adjusting the amount of charge pumped per unit time by said pump over a continuous range of values as a function of said substrate bias voltage, such that the charge pumped to the substrate is just sufficient to maintain the substrate bias voltage at some predetermined value. A capacitor is preferably used in the charge pump to store charge being pumped from the substrate. This controlling means may include the use of a variable impedance device during pump precharging and/or may include driving the pump using a voltage-controlled oscillator and means for controlling the frequency of the output signal of the oscillator as a function of the present value of the substrate voltage More specifically, the present invention comprises a sensor which monitors the substrate bias voltage, and generates a reference voltage for a variable impedance device and an oscillator bias voltage for controlling the frequency of a voltage-controlled oscillator. The regulating voltage to the variable impedance device causes the device to continuously vary the amount of charge available to be pumped from the substrate depending on the substrate bias voltage. The frequency of the oscillator's output signal is continuously controlled by the oscillator bias voltage from the sensor. The output signal is coupled to a charge pump which charges the substrate of the semiconductor device.

DETAILED DESCRIPTION OF THE INVENTION

The present invention is principally for use in MOS circuits to ensure that the substrate bias voltage is generated and maintained at a level sufficient for proper operation over a wide temperature range. The high-temperature operation as well as the large die size of newer MOS devices present particularly severe substrate current leakage problems. The circuit of the present invention supplies the required substrate current and also minimizes current consumption over the full operating temperature range. The present invention is self-contained and conveniently applicable to existing MOS circuits.

Figure 1:
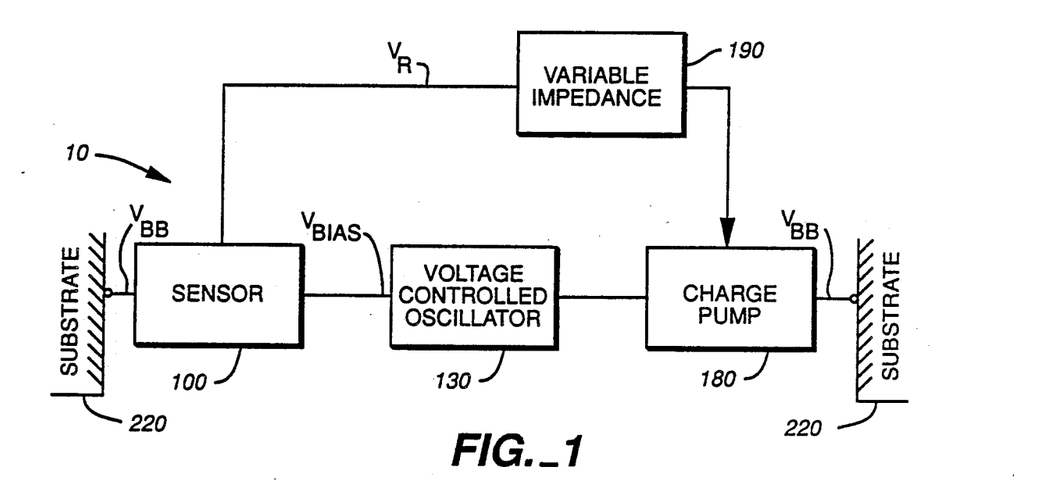
FIG. 1 is a schematic block diagram showing the general operation of the present invention.

A substrate bias voltage generating and regulating apparatus according to the present invention is shown at 10 in schematic block diagram form in FIG. 1. A sensor 100 translates substrate bias voltage $V_{BB}$ on a substrate 220 into a bias voltage $V_{Bias}$ and a regulating voltage $V_R$. $V_{Bias}$ is coupled to a voltage controlled oscillator (VCO) 130. $V_{Bias}$ controls the frequency of VCO 130 which in turn controls charge pump 180. That is, the frequency output of VCO 130 will change in response to $V_{Bias}$ to cause charge pump 180 to produce and maintain a desired level of substrate bias voltage $V_{BB}$ by driving charge pump 180. Sensor 100 also transmits a regulating voltage $V_R$ to a variable impedance device 190 which controls the charge available to the pump 180 so that the charge pumped is just sufficient to maintain $V_{BB}$ at the desired negative voltage. The VCO 130 and variable impedance device 190 therefore each act as means for limiting the current (i.e. the charge per unit time) supplied to the substrate by charge pump 180 in a continuously variable manner in response to the substrate bias voltage so as to maintain the substrate bias voltage $V_{BB}$ at a predetermined value.

Figure 2:
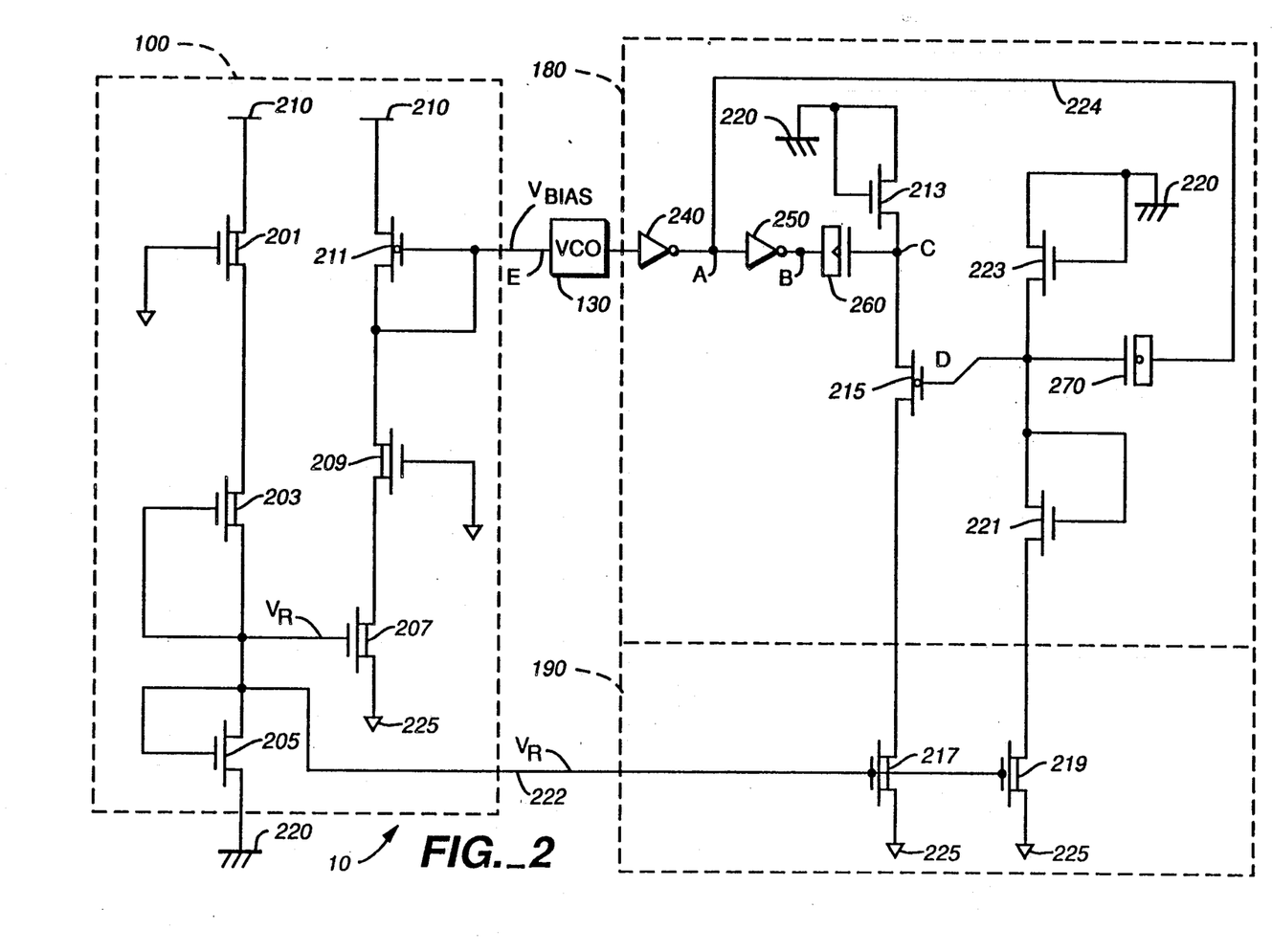
FIG. 2 is a schematic circuit diagram of an embodiment of the present invention.

A more detailed view of the circuit 10 of the present invention is presented in FIG. 2. Depletion mode transistor 201 has its drain connected to a power source 210, its gate grounded, and its source connected to the drain of depletion mode transistor 203. Transistor 203 has its source connected to its gate, to the gate of depletion mode transistor 207, and to the drain of n-type enhancement mode transistor 205. Transistor 205 has its source connected to substrate 220 and its gate connected to its own drain (and thereby the source of transistor 203 also) and to conductor 222 which carries regulating voltage $V_R$. Transistor 207 has a grounded source and a drain connected to the source of depletion mode transistor 209 which has its gate grounded and its drain connected to the drain of p-channel transistor 211 and to the input of voltage-controlled oscillator (VCO) 230. Transistor 211 has its source connected to power source 210 and its gate connected to its own drain and to the drain of transistor 209 and to the input of VCO 230. The components just described comprise sensor 100 in this embodiment of the present invention. The output of VCO 230 is fed to a charge pump 180, wherein it is initially buffered by inverting amplifiers 240 and 250 with the output of inverter 240 connected to the input of inverter 250 and to an antiphase circuit to be described below. The output of inverter 240 is designated node A and the output of inverter 250 is designated node B.

The output of inverter 250 is connected to a charge storage means preferably, comprising a capacitor 260 which is a 30 pf to 50 pf M.O.S. capacitor where a heavily n-type doped channel forms one electrode and the M.O.S. gate forms the second electrode. The gate of capacitor 260 is connected to the source of n-type enhancement mode transistor 213 and to the source of p-channel enhancement mode transistor 215. This is identified as node C in FIG. 2. Transistor 213 has its gate and drain connected to substrate 220 and its source also connected to the source of transistor 215. The drain of transistor 215 is connected to the drain of depletion mode transistor 217 which has its source grounded and its gate connected to conductor 222 (and the regulating voltage $V_R$) and to the gate of depletion mode transistor 219. Transistor 219 has its source grounded and its drain connected to the source of enhancement mode transistor 221. Transistor 221 has its gate connected to its drain which is connected to the gate of transistor 215, to the gate of n-channel capacitor 270 (which is 1 pf to 2 pf), and to the source of enhancement mode transistor 223. This is identified as node D in FIG. 2. Transistor 223 has its drain connected to its own gate and to substrate 220. The lower electrode of capacitor 270 is connected to the antiphase loop, mentioned earlier, which connects back through conductor 224 to the output of inverter 240. The components just described comprise charge pump 180 and variable impedance 190 in this embodiment of the present invention, as shown by the dashed lines in FIG. 2.

In operation, transistors 201, 203, and 205 in sensor 200 establish a regulating voltage $V_R$. Transistor 201 sets the voltage applied to the drain of transistor 203. Transistor 203 allows sufficient current (typically 0.5 to 1.0 $\mu A$) from voltage source 210 to flow into enhancement mode transistor 205 so that transistor 205 is turned on with approximately 1 volt (its threshold) appearing across it. This voltage is approximately the enhancement transistor voltage $V_{TE}$. At the same time, in order to produce a $V_{BB}$ of $-3$ volts, once a steady state condition has been reached in circuit 10, a regulating voltage $V_R$ of approximately $-2$ volts is created and is coupled to the gate of depletion mode transistor 217, which, as described below, comprises a variable impedance device 190 for controlling the amount of charge pumped by charge pump 180 in response thereto. Voltage $V_R$ also controls the bias voltage value that is fed to VCO 130, thereby providing a second means for adjusting the amount of charge pumped by charge pump 180, as also described below.

The VCO 130 output signal is fed through inverting amplifiers 240 and 250, which also serve as buffers for VCO 230, to provide the driving signals for charge pump 180. Charge pump 180 includes a pump consisting of capacitor 260 and transistors 213 and 215, and a voltage shifting circuit consisting of capacitor 270 and transistors 223 and 221. The pump pumps charge out of substrate 220 while the voltage shifting circuit is used to generate a voltage level on node D sufficient to turn on transistor 215. Transistor 215 acts as a switch to control charge flow between node C and ground, as described in greater detail below.

Charge pump 180 operates in the following way. When inverter 250 goes low and node C is capacitively driven one voltage threshold more negative than substrate 220, charge is transferred through transistor 213 from substrate 220. This is defined as a "pump cycle." In this example, the charge is being construed as a positive polarity. It would also be conventional to construe charge as being a negative polarity, in which case charge would be characterized as flowing "into" substrate 220 rather than "from" the substrate. Charge flow direction also depends on whether the bias voltage desired is a positive or negative polarity voltage. Thus, when charge flow direction is specified herein, the broadest interpretation of this term is to be presumed.

When the output of inverter 250 goes high, capacitor 260 couples its gate and node C high. Transistor 213 acts to block charge conduction from the capacitor 260 back into substrate 220. That is, it functions as a diode which allows charge conduction only in one direction from the substrate 220 to capacitor 260. At the same time, transistor 215 is turned on, and charge is transferred from capacitor 260 and node C to ground through transistor 217. This is defined as a "precharge cycle."

In more detail, the operation is as follows. During a pump cycle, node A (the output of inverter 240) goes high (e.g. to a level approximately equal to $V_{CC}$, the power source voltage level). This causes node D (the gate of capacitor 270) to be coupled high, which turns off p-channel transistor 215. When node A goes high, node B (the output of inverter 250) goes low and node C (the gate of capacitor 260) is coupled low. When node C is capacitively driven to a voltage one threshold voltage more negative than substrate 220 in this manner, transistor 213 will be turned on or become conductive and charge will flow from substrate 220 to node C, partially discharging capacitor 260. Since transistor 215 is off, no charge will flow from ground 225 but capacitor 260 will be partially discharged. When node A goes low, node D is coupled low which turns on p-channel transistor 215. At the same time, node B goes high which couples node C high through capacitor 260. However, node C is held at ground as the capacitive displacement current flows through transistors 215 and 217 to ground which recharges capacitor 260. Thus charge is pumped out of substrate 220 on to capacitor 260 during a pump cycle and then charge is pumped out of capacitor 260 to ground 225 during a precharge cycle.

The voltage level shifting circuit level shifts the voltage on node D in the following manner. When node A is high, node D is capacitively coupled high, and current will flow through transistors 221 and 219 to ground. In this case, the high level of node D is clamped to one enhancement threshold above ground and transistor 215 is turned off. When node A goes low, node D is capacitively coupled low, to about $-3$ volts, which turns on transistor 215. In this manner, transistor 215 serves as a switch between the gate of capacitor 260 (node C) and ground. That is, when ON, transistor 215 conducts current to ground during the precharge cycle and, when OFF, it allows node C to be coupled below the substrate voltage during a pump cycle.

The regulating voltage $V_R$ controls the resistance of transistors 217 and 219 during the precharge cycle such that the substrate voltage $V_{BB}$ is maintained at the value of $V_{TD}-V_{TE}$ which is typically $-3$ volts. The voltage $V_{TD}$ is the threshold voltage of depletion mode transistor 217. As described above, $V_{TE}$ is the threshold voltage of transistor 205.

The regulation by the variable impedance device 190 works in the following way. As $V_{BB}$ is pumped to $-3$ volts by charge pump circuit 280, the regulating voltage $V_R$ on conductor 222 is pulled down by enhancement transistor 205 to about $-2$ volts. As the voltage on the gates of depletion mode transistors 217 and 219, which are connected to conductor 222, approaches the depletion threshold (which is approximately $-2$ volts), they begin to turn off. As transistor 217 turns off, the impedance of the path to ground is increased so less current will flow through transistor 215 and 217 to ground when node C is coupled high (see the description of the charge pump operation) which then limits the amount of charge available to be pumped from the substrate 220 into ground 225.

If the substrate voltage $V_{BB}$ is more positive than $-3$ volts, and $V_R$ is more positive than $-2$ volts, transistor 217 is turned on harder, such that the impedance of the path to ground is lower, and node C is clamped to ground when node B is high. This "precharges" pump capacitor 260 to a full 5 volts as node B is at $V_{CC}$ and node C is held at ground. When the voltage at node B falls from $V_{CC}$ to ground, capacitor 260 capacitively couples node C from ground towards $-V_{CC}$. However, when node C reaches $V_{BB}-V_{TE}$ (approximately $-4$ volts), transistor 213 turns on and charge flows from substrate 220 to node C, which partially discharges capacitor 260.

In this manner, transistor 217 acts as a variable impedance device between the gate of capacitor 260 and ground during a precharge cycle. The impedance of transistor 217 is controlled by the regulating voltage $V_R$. Once $V_{BB}$ is pumped down to about $V_{TD}-V_{TE}$ (approximately $-3$ volts), transistor 217 turns off as described above and node C is no longer clamped to ground when node B is at $V_{CC}$. Instead, node C rises to about $+1$ volts when node B is at $V_{CC}$, which means the pump capacitor 260 is only "precharged" to 4 volts. When node B is taken low, node C is capacitively coupled through capacitor 260 to $-4$ volts where charge from substrate 220 just begins to flow through transistor 213 to node C. The charge pump finally stabilizes at the point where the clamp current through transistor 217 just matches the substrate current necessary to maintain the substrate potential at $V_{TD}-V_{TE}$.

The effect on node D of transistor 219 turning off as $V_R$ approaches $V_{TD}$ is analogous to the effect described above of transistor 217 on node C. As transistor 219 begins to turn off, node D is no longer effectively clamped to a $V_{TE}$ of one volt above ground through transistors 219 and 221. Node D then rises up to 2 volts or 2.5 volts when node A is high and falls to about $-2$ volts when node A is low, which still turns p-channel transistor 215 on and off properly but assures that node D does not go low enough to turn on transistor 223 and thereby pump substrate 220 to a more negative voltage.

Regulating voltage $V_R$ is also coupled to the group of transistors 207, 209, and 211 which generate a bias voltage to voltage-controlled oscillator (VCO) 130.

If $V_{BB}$ is more negative than $-3$ volts, then 207 will draw less current. With less current, VCO 130 operates at a lower frequency, and pump 180 will pump less charge. If $V_{BB}$ is more positive than $-3$ volts, then 207 will draw more current and VCO 130 will operate at a higher frequency and pump 180 will pump more charge.

The maximum current that flows though transistor 207 is limited by grounded-gate depletion mode transistor 209. This maximum current also flows through transistor 211 which establishes a bias voltage on node E, the gate of transistor 211, which is coupled to voltage-controlled oscillator (VCO) 130. The bias voltage controls the frequency of the oscillator output signal. In operation, if $V_{BB}$ is close to $V_{TD}-V_{TE}$ (about $-3$ volts), then the current through transistor 207 will be very low, resulting in very low current flow through transistor 211. This sets the $V_{BIAS}$ voltage on node E at close to one $V_{TE}$ below $V_{CC}$, which results in very low current flow in the VCO circuit 130. That is, the bias circuit consumes very little current when $V_{BB}$ is at normal levels, and thus the present invention minimizes current consumption in the substrate bias circuitry.

If the value of $V_{BB}$ is close to ground (which would be the case, for example, just after power is applied to the device), transistor 207 could draw very large amounts of current if depletion transistor 209 did not limit the current. Such a large current would cause VCO 130 to operate at too high a frequency, resulting in inefficiency, so transistor 209 sets the maximum current and thereby also provides a high frequency limit on VCO 130. VCO 130 is never turned off during operation of the circuit, and thus avoids overshooting and sawtooth-like variations of the substrate bias voltage. VCO 130 operates at a continuously varying frequency to provide an output signal to control the rate of charge pumping. Thus, charge pump 280 may be operated efficiently with an upper bound on power and frequency while producing and maintaining the desired substrate bias voltage.

In this way, according to the present invention, the amount of current drawn from substrate 220 is regulated so that only that amount of current necessary to maintain the substrate bias voltage at the desired value is actually supplied. This is particularly important given the different current demands of the active and standby modes and the high operating temperatures of EE-PROM devices which also experience higher current demands due to larger current leakages.

The operation of the present invention is illustrated schematically with reference to the timing diagrams of FIGS. 3A-3E (large-scale operation) and 4A-4G (small scale operation).

Figure 3A:
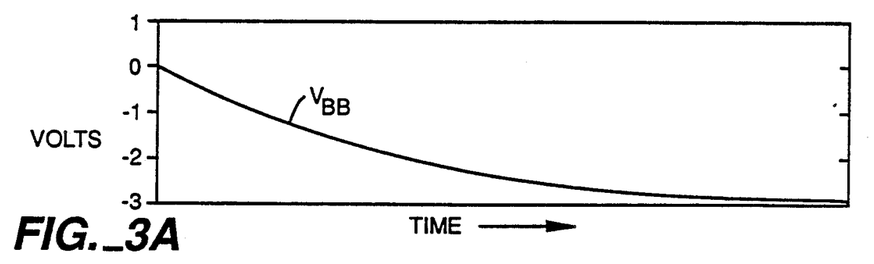
FIG. 3A shows the large scale variation with time of the substrate bias voltage, $V_{BB}$, according to the present invention.
Figure 3B:
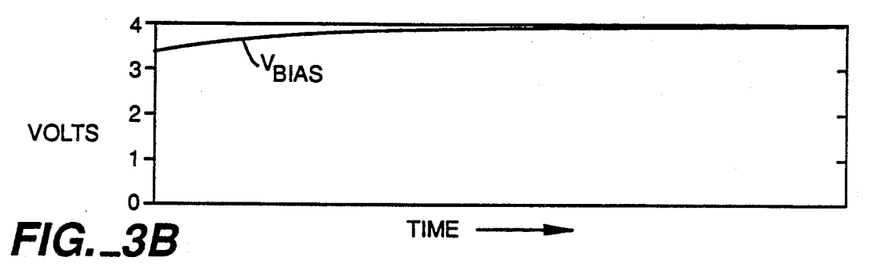
FIG. 3B shows the large scale variation with time of the bias voltage, $V_{Bias}$, according to the present invention.
Figure 3C:
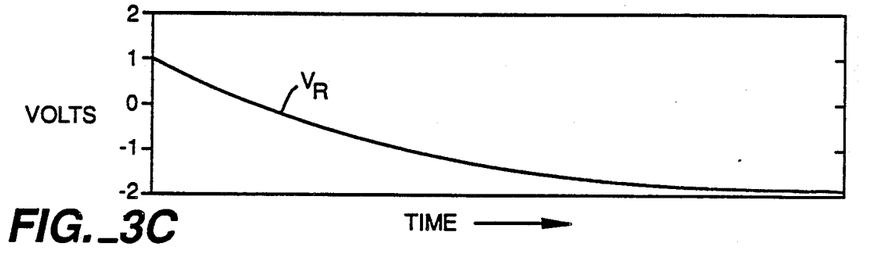
FIG. 3C shows the large scale variation with time of the regulating voltage, $V_R$, according to the present invention.
Figure 3D:
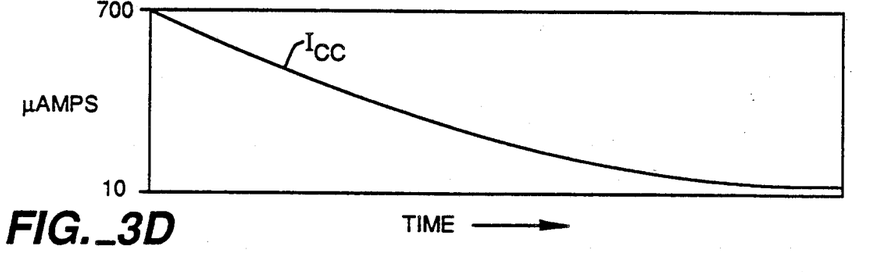
FIG. 3D shows the large scale variation with time of the current from the power source, $I_{CC}$, according to the present invention.
Figure 3E:
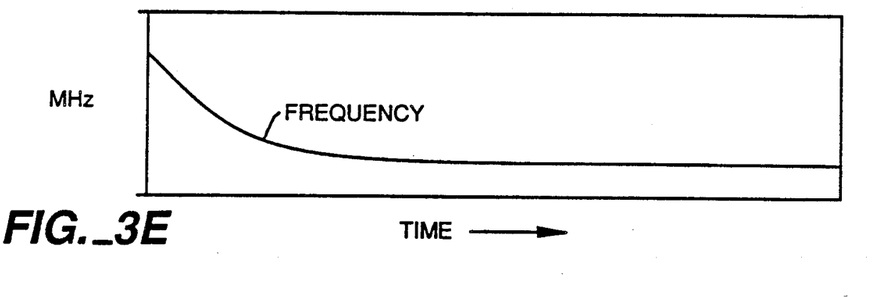
FIG. 3E shows the large scale variation with time of the frequency of the output signal of the voltage-controlled oscillator, according to the present invention.

FIG. 3A shows the substrate bias voltage $V_{BB}$ which will be described in conjunction with FIG. 2. $V_{BB}$ starts at zero volts when the power is turned on. Charge pump 180 pulls $V_{BB}$ down to the desired negative voltage, in this case, $-3$ volts. FIG. 3B shows the bias voltage $V_{Bias}$ coupled to VCO 130. As $V_{BB}$ becomes more negative, $V_{Bias}$ increases from approximately 3.5 volts to 4 volts as a result of less current being passed through transistors 207 and 211. FIG. 3C shows the regulating voltage $V_R$ which starts at 1 volt when $V_{BB}$ is 0 volts. As $V_{BB}$ becomes more negative to $-3$ volts, $V_R$ reaches $-2$ volts (or one threshold above $V_{BB}$) FIG. 3D shows the current $I_{CC}$ from power source 210. When the power is turned on, substrate 220 is at zero bias, so $I_{CC}$ is large, starting, for example, at approximately 700 μA. When $V_{BB}$ is sufficiently negative, $I_{CC}$ will be reduced to approximately 10 μA, depending on the current leakage from substrate 220. If there is large leakage, then $I_{CC}$ will be higher. The operating frequency of VCO 130, shown in FIG. 3E, behaves in the same way as $I_{CC}$. When $V_{BB}$ is at 0 volts, VCO 130 operates at its highest frequency. If the frequency were too high, charge pump 180 would pump inefficiently, so this highest frequency is limited by transistor 209. That is, when transistor 207 is fully on, the current is limited by 209. As $V_{BB}$ approaches $-3$ volts, transistor 207 limits the current to a level well below the level set by transistor 209, thereby reducing the frequency of operation of $V_{CO}$ 130. Eventually the frequency reaches a value whereby the current from pump 180 matches the leakage current from substrate 220 and $V_{BB}$ is maintained at $-3$ volts.

Figure 4A:
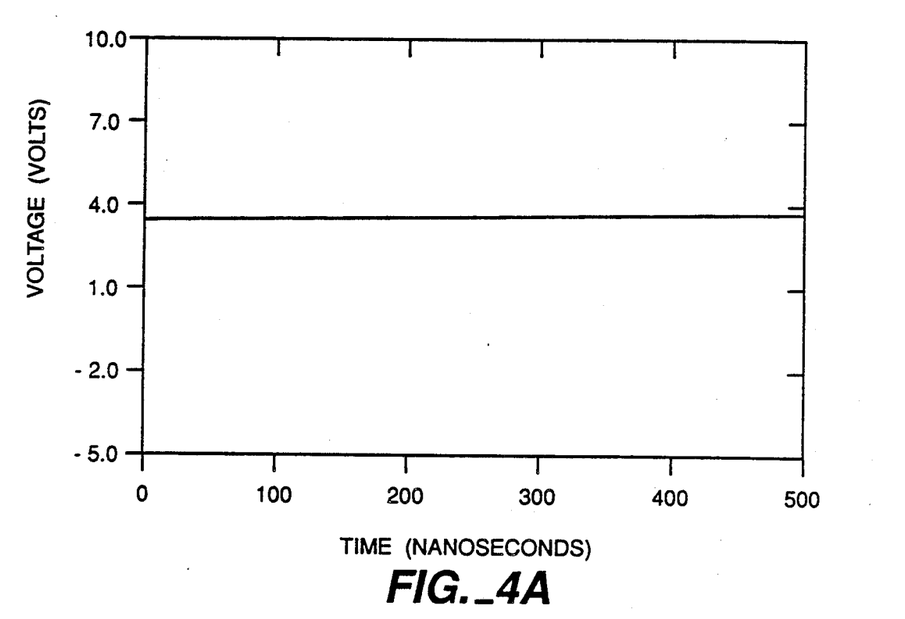
FIG. 4A shows the small scale variation with time of the bias voltage, $V_{Bias}$, according to the present invention.
Figure 4B:
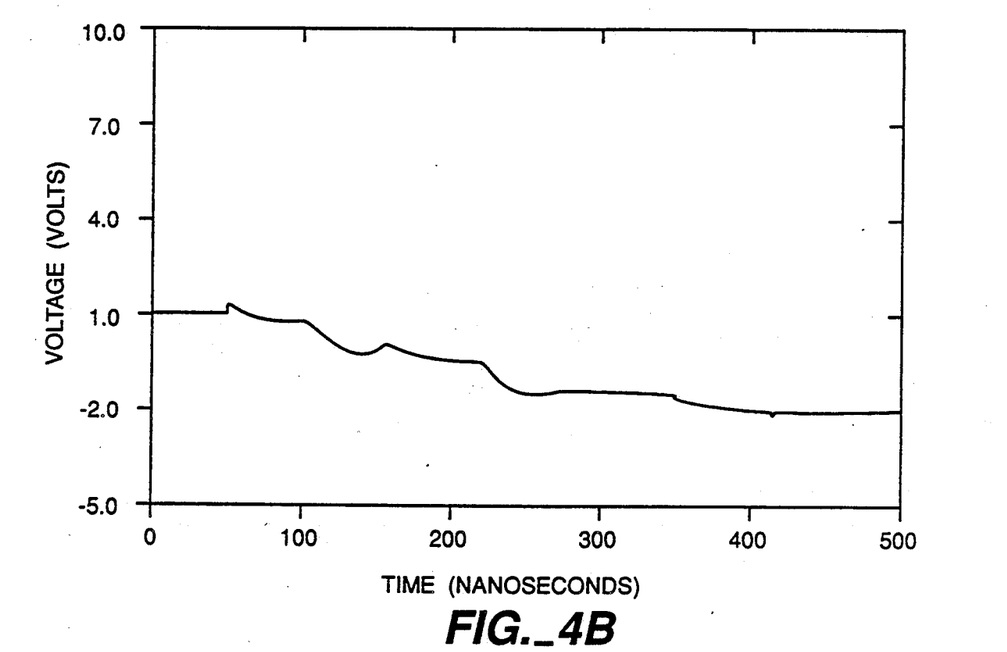
FIG. 4B shows the small scale variation with time of the regulating voltage, $V_R$, according to the present invention.
Figure 4C:
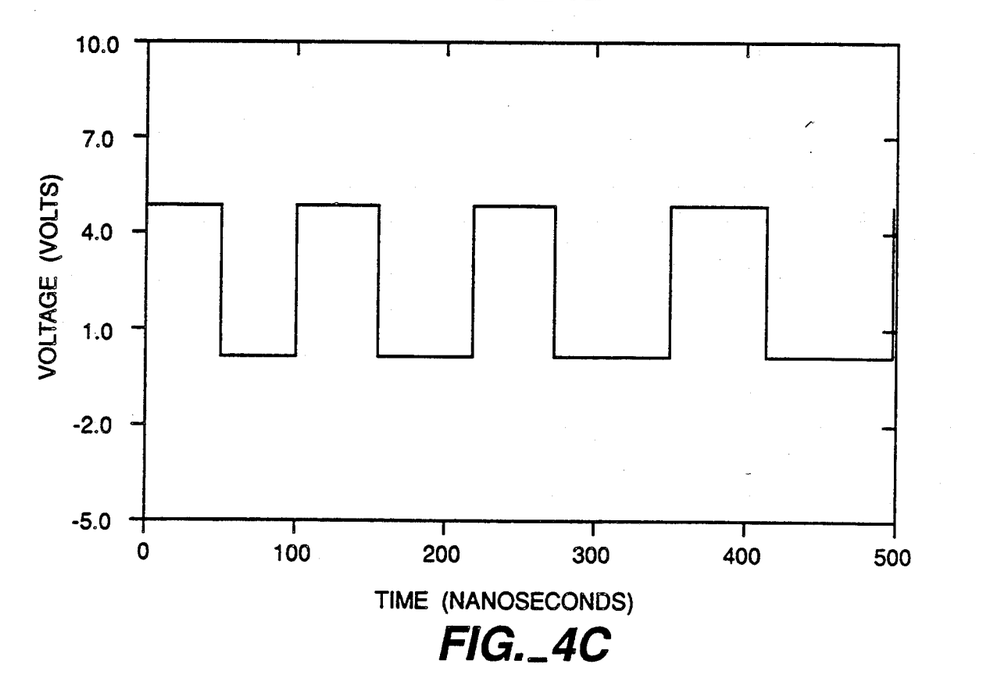
FIG. 4C shows the small scale variation with time of the voltage output of the voltage-controlled oscillator at node A of the circuit of the present invention.
Figure 4D:
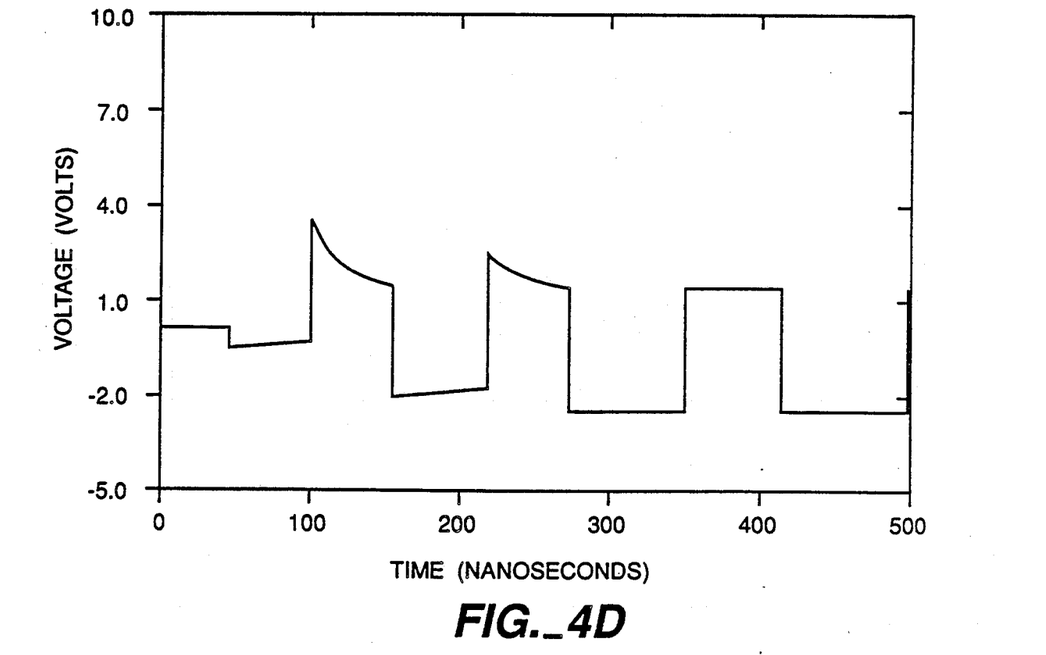
FIG. 4D shows the small scale variation with time of the voltage output of the voltage-controlled oscillator at node D of the circuit of the present invention.
Figure 4E:
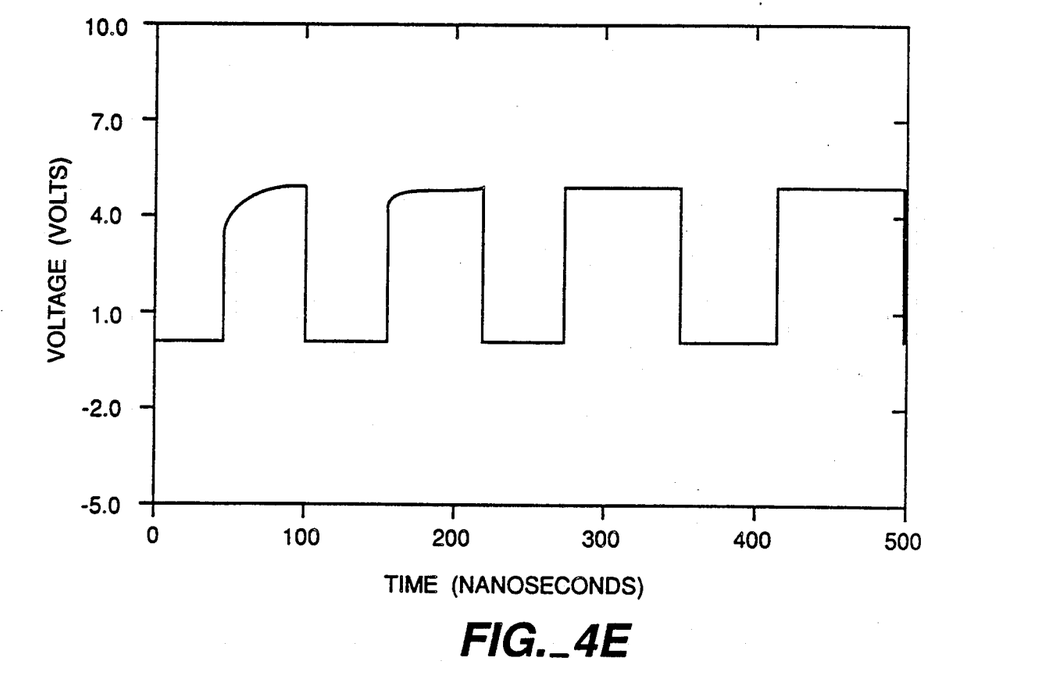
FIG. 4E shows the small scale variation with time of the voltage output of the voltage-controlled oscillator at node B of the circuit of the present invention.
Figure 4F:
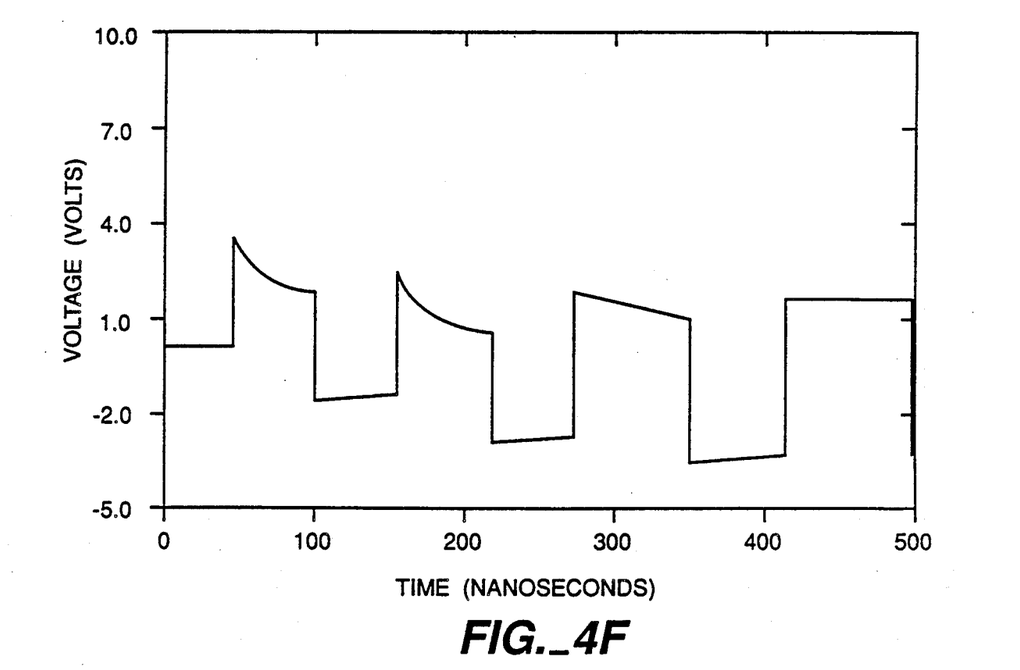
FIG. 4F shows the small scale variation with time of the voltage output of the voltage-controlled oscillator at node C of the circuit of the present invention.
Figure 4G:
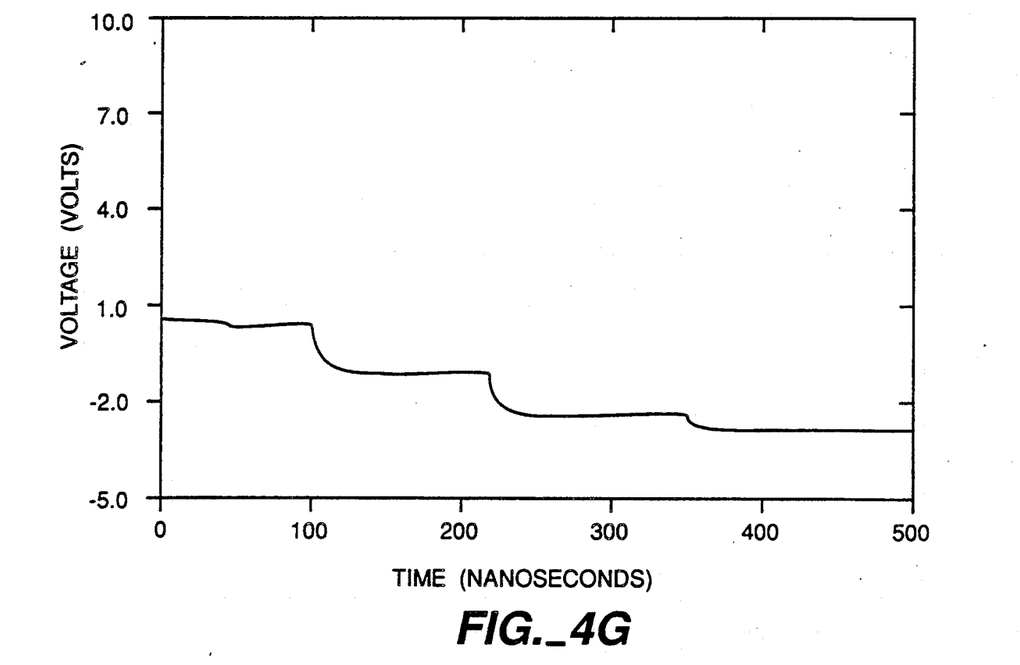
FIG. 4G shows the small scale variation with time of the substrate bias voltage, $V_{BB}$, according to the present invention.

FIGS. 4A-4G show the variations of the various voltages as they go high and low at different nodes of the circuit of the present invention. In a typical case, $V_{BB}$ will reach $-3$ volts in approximately 100 μsec after power-on. FIG. 4A shows $V_{Bias}$, in a higher resolution view, increasing from 3.5 volts to 4 volts at node E (the input to VCO 130). FIG. 4B shows $V_R$ responding in small steps to the high/low switching of the charge pump 180. As $V_R$ goes more negative than $-2$ volts (for a $-3$ volt $V_{BB}$), then $V_{Bias}$ goes higher, which lowers the frequency from VCO 130, causing less charge to be pumped. FIG. 4C shows the high/low voltage variation at node A (the output of inverter 240). Note the increasing period of the square wave as $V_{Bias}$ increases. This shows the frequency decreasing as $V_{BB}$ approaches $-3$ volts, thereby making the approach gradual and avoiding overshooting. FIG. 4D shows the voltage at node D. This is significant because it is the voltage controlling the gate of clamping diode transistor 215 which controls the pumping efficiency of pump 180. Node D starts at ground potential, and then its high level is clamped by transistor 221 to one $V_{TE}$ above ground, and its low voltage level is $V_{BB}+V_{TE}$ or approximately $-2$ volts. FIG. 4E shows the voltage at node B (the output of inverter 250 driving capacitor 260). It oscillates out-of-phase with the voltage at nodes A and D and, as at node A, the frequency decreases as $V_{BB}$ decreases. FIG. 4F shows the voltage variation at node C (the gate of capacitor 260). It starts with its high level clamped close to ground and, when its low level goes one threshold below $V_{BB}$, it pulls charge from the substrate through transistor 213. Thus, it decreases as $V_{BB}$ decreases towards $-3$ volts. FIG. 4G shows the decrease of $V_{BB}$ in steps corresponding to the steps of the voltages at the various nodes.

Figure 5:
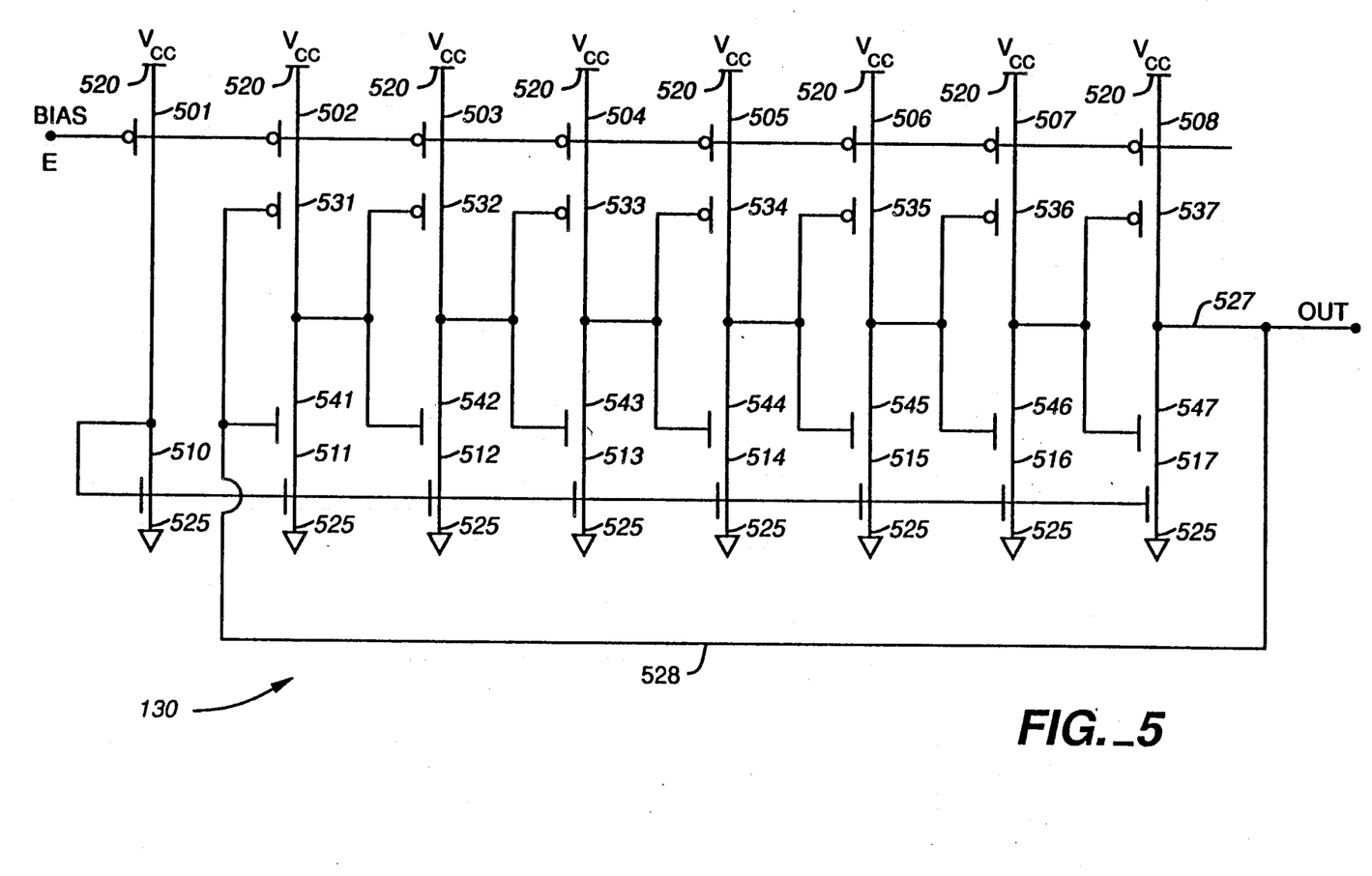
FIG. 5 is a schematic diagram of the circuit of a voltage-controlled ring oscillator according to the present invention.

Voltage-controlled oscillator (VCO) 130 may conventionally comprise a 7-stage ring oscillator, an embodiment of which is shown schematically in FIG. 5. A series of common-gated p-type enhancement mode transistors 501-508 are connected to node E ($V_{Bias}$). Transistors 501-508 all have their sources connected to positive voltage source 520. The drain of transistor 501 is connected to the drain of n-type enhancement mode diode connected transistor 510. Transistor 510 is connected to a series of common-gated n-type enhancement mode transistors 511-517. Transistors 510-517 all have their sources connected to ground at 525. In between these two sets of transistors are sets of common-gated p-type enhancement mode transistors 531-537 and n-type enhancement mode transistors 541-547. Transistors 531-537 have their sources connected to the drains of transistors 502-508 respectively. The drains of transistors 531-537 are connected to the drains of transistors 541-547 respectively, which are also connected to the common gates of the succeeding pair of p-type and n-type transistors. Output line 527 is connected to the drain of transistor 537 and the drain of transistor 547. Feedback loop 528 connects output line 527 back to the gates of transistor pair 531 and 541.

In operation, VCO 130 is a ring oscillator producing a square wave output. Each pair of p-type and n-type transistors 531-537 and 541-547 function as an inverter. Since the pairs of transistors are connected in series, the voltage is inverted through each pair of transistors, thereby producing the oscillation when there is an odd number of such pairs of transistors in the rings. The frequency of the oscillation is controlled by the bias current in the following manner: $V_{Bias}$ controls the current of p-type transistors 501-508 and the current is mirrored through n-type diode transistor 510 and n-type transistors 511-517. This current is supplied to the pairs of transistors acting as inverters. As an example, transistor pair 531/541 sends its output to the input (gates) of transistor pair 532/542 which constitutes a capacitive load on pair 531/541 which is just the gate capacitance of the transistors By controlling the current into each transistor pair, the time to charge and discharge the capacitive loading is controlled. At each pair of transistors, the p-type and the n-type will pull oppositely, thus p-type transistors 502-508 and n-type transistors 511-517 will control the voltage depending on which of the p- or n-type transistors in the pairs are on. In other words, $V_{Bias}$, by controlling the amount of current flowing between voltage source 520 to ground 525, thereby controls the frequency through controlling the charge and discharge time of the gate capacitance of the transistor pairs. Thus the frequency of the oscillation may be decreased in response to the bias voltage in a manner shown in, for example, FIGS. 3E and 4C. One embodiment of the present invention utilizes a 7-stage oscillator to produce a square wave. It will be appreciated that various oscillators known in the art are within the scope of the present invention.

In summary, when $V_{BB}$ is more negative than desired, very little or no current is consumed, and when $V_{BB}$ is higher than desired, the pumping frequency increases and the amount of precharge on the pump capacitor increases accordingly to cause the $V_{BB}$ to return to the desired voltage. The present invention supplies just the right amount of current needed (i.e., the charge per unit time) to maintain $V_{BB}$ at the desired voltage level. During active-to-standby transitions when the device's junction temperature may be very high, resulting in large substrate leakage, the voltage-controlled oscillator will consume correspondingly more current. Since the standby current needs are low, the junction temperature will decrease and the substrate leakage will likewise decrease. Once the junction temperature is low, the voltage-controlled oscillator will operate at a lower frequency with lower current consumption sufficient to meet the standby current specification. This gradual decrease of the frequency as $V_{BB}$ approaches the desired level eliminates any sawtooth variation of substrate bias voltage and creates a stable $V_{BB}$. This stable substrate bias voltage is maintained even at the high ambient temperatures required in military specifications (typically 125° C.).

The present invention has no external inputs other than supply voltage, needs no control signals, and is self-contained. It can therefore be utilized in any integrated circuit layout, in any disposition, for instance, stand-alone, chained, and other ways known in the art. The present invention regulates the substrate bias voltage at the lowest possible current consumption which is extremely important, for instance, in CMOS battery-operated and other low-power uses.

The above description of the present invention has been made with respect to an apparatus for generating and maintaining substrate bias voltages in EEPROMs and similar devices. It will be apparent to those skilled in the art that the present invention is applicable to a much larger class of circuits. For example, the present invention is applicable to memories and microprocessors of all kinds. In fact, the present invention solves the problem of switching noise in general because all the nodes in circuits which are tied to the substrate require low noise for proper operation.

Accordingly, there has been described herein a novel circuit for generating and regulating bias voltages. Various modifications to the present invention will become apparent to those skilled in the art from the foregoing description and accompanying drawings. Accordingly, the present invention is to be limited solely by the scope of the following claims.

What is claimed is:

1. An improved bias voltage generator and regulator apparats for generating and regulating a substrate bias voltage of a semiconductor device comprising:

a variable frequency oscillator for generating an oscillating signal;

a charge pump, coupled to the substrate of the semiconductor device, for pumping charge from the substrate of the semiconductor device in response to said oscillating signal, said pump including a capacitor, a cycle means for pumping charge from said capacitor to ground during a pre-charge cycle and for pumping charge from the substrate to said capacitor during a pump cycle, and means for controlling the amount of charge on said capacitor as a function of said substrate bias voltage, such that the charge pumped is just sufficient to maintain the substrate bias voltage at a predetermined value, said charge controlling means including a variable impedance device coupled between said capacitor and ground and regulating means for controlling the resistance of said variable impedance device; and means responsive to the substrate bias voltage for controlling the frequency of said oscillating signal.

2. The apparatus of claim 1 wherein said cycle means includes means for preventing charge conduction to said substrate during said precharge cycle.

3. The apparatus of claim 1 wherein said regulating means comprises a sensor for sensing the substrate bias voltage and for generating a regulating voltage and for providing said regulating voltage to said variable impedance device in response to said sensed substrate bias voltage.

4. The apparatus of claim 3 wherein said sensor includes a MOS field effect sensor transistor having a source, a drain and a gate, said source connected to said substrate and said gate connected to said drain and means for providing sufficient current to said transistor such that said transistor is turned on with approximately its threshold voltage appearing across it.

5. The apparatus of claim 4 wherein said variable impedance device comprises an MOSFET device including a source, a drain and a gate, source coupled to ground and having said regulating voltage provided to its gate.

6. The apparatus of claim 5 wherein said variable impedance MOSFET device comprises an n-channel depletion mode transistor and said sensor transistor comprises an n-channel enhancement mode transistor.

7. The apparatus of claim 6 wherein said predetermined value of the substrate bias voltage is established by the magnitude of the depletion threshold of said n-channel depletion mode transistor and the magnitude of the enhancement threshold of said n-channel enhancement mode transistor.

8. The apparatus of claim 1 wherein said pump cycle duration is equal to a first portion of the duration of the period of each oscillation of said oscillator and wherein said precharge cycle is equal to the remaining portion of said duration of the period of each oscillation of said oscillator.

9. An improved bias voltage generator and regulator apparatus for generating and regulating a substrate bias voltage of a semiconductor device comprising:

a variable frequency oscillator for generating an oscillating signal;

a charge pump, coupled to the substrate of the semiconductor device, for pumping charge from the substrate of the semiconductor device in response to said oscillating signal, said pump including a capacitor, a cycle means for pumping charge from said capacitor to ground during a pre-charge cycle and for pumping charge from the substrate to said capacitor during a pump cycle, said cycle means including means for preventing charge conduction to said substrate during said pre-charge cycle, means for controlling the amount of charge on said capacitor as a function of said substrate bias voltage, such that the charge pumped is just sufficient to maintain the substrate bias voltage at a predetermined value, and means for providing said oscillating signal to said charge pump, the duration of said pump cycle and said pre-charge cycle being a function of said oscillating signal; and means responsive to the present value of the subtrate bias voltage for controlling the frequency of said oscillating signal wherein said means responsive to the substrate bias voltage includes a sensor for sensing the substrate bias voltage and for generating an oscillator bias voltage and for providing said oscillator bias voltage to said variable frequency oscillator for controlling the frequency of said oscillator.

10. The apparatus of claim 9 wherein said sensor includes a MOS field effect sensor transistor having a source, a drain and a gate, said source connected to said substrate and said gate connected to said drain and means for providing sufficient current to said transistor such that said transistor is turned on with approximately its threshold voltage appearing across it.

11. The apparatus of claim 10 wherein said controlling means further comprises a variable impedance device for controlling the amount of charge pumped from said capacitor during said precharge cycle and regulating means for controlling the resistance of said variable impedance device as a function of a present value of the substrate bias voltage 12. The apparatus of claim 11 wherein said variable impedance device comprises a MOSFET device having a source coupled to ground and having said regulating voltage provided to a gate of said MOSFET device.

13. The apparatus of claim 12 wherein said variable impedance MOSFET device comprises an n-channel depletion mode transistor and said sensor transistor comprises an n-channel enhancement mode transistor.

14. The apparatus of claim 13 wherein said predetermined value of the substrate bias voltage is established by the magnitude of the depletion threshold of said n-channel depletion mode transistor and the magnitude of the enhancement threshold of said n-channel enhancement mode transistor.

15. The apparatus of claim 2 wherein said cycle means includes switch means for conducting charge from said capacitor to ground during said precharge cycle and for preventing charge conduction from said capacitor during said pump cycle, said switch means being connected in series between said capacitor and ground.

16. The apparatus of claim 15 wherein said means for controlling the amount of charge pumped by said charge pump further includes a voltage level generator for generating first and second voltage levels at said switch means for causing said switch means to switch between said precharge and said pump cycles.

17. The apparatus of claim 16 wherein said means for controlling the amount of charge pumped by said charge pump includes a sensor for sensing the substrate bias voltage and for generating an oscillator bias voltage provided to said oscillator and a regulating voltage provided to said charge pump and to said voltage level generator.

18. An improved bias voltage generator and regulator apparatus for generating and regulating a substrate bias voltage of a semiconductor device comprising:

a variable-frequency oscillator for generating an oscillating signal;

a charge pump, coupled to the substrate of the semiconductor device, for pumping charge from the substrate of the semiconductor device in response to the oscillating signal, said pump including a capacitor, means for controlling the amount of charge on said capacitor such that the charge pumped from the substrate is just sufficient to maintain the substrate bias voltage at a predetermined value, and cycle means for pumping charge from said capacitor to ground during a precharge cycle and for pumping charge from the substrate to said capacitor during a pump cycle, said cycle means including means for preventing charge conduction to said substrate during said precharge cycle and switch means for conducting charge from said capacitor to ground during said precharge cycle and for preventing charge conduction from said capacitor to ground during said pump cycle, said switch means being connected in series between said capacitor and ground, said means for controlling the amount of charge on said capacitor including a variable impedance device being coupled in series with said switch means between said capacitor and ground, and including regulating means for controlling the resistance of said variable impedance device as a function of the present value of the substrate bias voltage; and means responsive to the value of the substrate bias voltage for controlling the frequency of said oscillating signal.

19. The apparatus of claim 18 wherein said means for controlling the amount of charge pumped by said charge pump further includes a voltage level generator for generating first and second voltage levels at said switch means as a function of said oscillating signal for causing said switch means to switch between said precharge and said pump cycles.

20. The apparatus of claim 18 wherein said variable-frequency oscillator is a voltage-controlled oscillator.

21. The apparatus of claim 20 wherein said voltage-controlled oscillator is a ring oscillator having a plurality of stages.

22. The apparatus of claim 18 wherein said regulating means comprises a sensor for sensing the substrate bias voltage and for generating a regulating voltage provided to said variable impedance device.

23. An improved bias voltage generator and regulator apparatus for generating and regulating a substrate bias voltage of a semiconductor device comprising:

a sensor for sensing said substrate bias voltage and producing an oscillator bias voltage and a regulating voltage;

a voltage-controlled oscillator coupled to said sensor for receiving said oscillator bias voltage and for continuously generating an oscillating signal having a frequency controlled by the value of said oscillator bias voltage; and a charge pump for pumping charge to the substrate of the semiconductor device, said pump being coupled to and controlled by the frequency of the oscillating signal from said oscillator, said pump further being coupled to said sensor for receiving said regulating voltage so as to cause said substrate bias voltage to be regulated at a predetermined voltage value.

24. The apparatus of claim 23 wherein said sensor comprises.

a first n-type depletion mode transistor (201) having a gate, a drain, and a source;

a second n-type depletion mode transistor (203) having a gate, a drain, and a source;

a first n-type enhancement mode transistor (205) having a gate, a drain, and a source;

a third n-type depletion mode transistor (207) having a gate, a drain, and a source;

a fourth n-type depletion mode transistor (209) having a gate, a drain, and a source;

a p-type enhancement mode transistor (211) having a gate, a drain, and a source;

said first n-type depletion mode transistor (201) having its gate connected to ground, its drain connected to a power source, and its source connected to the drain of said second n-type depletion mode transistor (203) having its gate connected to its source and its source connected to the drain of its gate connected to its drain, and its drain further connected to a regulating voltage conductor, providing a regulating voltage thereto, and its source connected to the substrate of the semiconductor device, said second n-type depletion mode transistor further having its gate connected to the gate of said third n-type depletion mode transistor (207) having its source grounded and its drain connected to the source of said fourth n-type depletion mode transistor (209) having its gate grounded and its drain connected to the drain of said p-type enhancement mode transistor (211) having its drain connected to its gate and its source connected to said power source, its gate and drain further connected to, and providing an oscillator bias voltage to, the input of said voltage-controlled oscillator.

25. The apparatus of claim 23 wherein said voltage-controlled oscillator is a ring oscillator for generating a square wave voltage output having a frequency responsive to said oscillator bias voltage comprising:

a plurality of p- and n-type enhancement mode transistors each having a gate, a source, and a drain;

a plurality of stages for inverting and shaping the square wave, each of said stages including a pair of said plurality of p- and n-type enhancement mode transistors having common gates and having the drains of said p-type transistors in said pairs connected to the drains of said n-type transistors in said pairs and both drains connected to the gate of an adjacent one of said pairs of a succeeding one of said stages;

a plurality of common-gated p-type enhancement transistors each having a gate, a source, and a drain and having as inputs to their gates said oscillator bias voltage, and having their sources connected to said power source and their drains connected to the sources of corresponding ones of said p-type transistors in said pairs of said stages;

a plurality of n-type enhancement mode transistors each having a gate, a source, and a drain and having common gates and drains connected to the drains of said n-type transistors in said pairs of said stages and sources connected to ground;

a first of said pairs of said stages having its common gate connected to a feedback conductor;

a last of said pairs of said stages having its common drain connected to said feedback conductor and to the output of said voltage-controlled oscillator;

an initial p-type enhancement mode transistor having a gate, a source, and a drain for receiving said oscillator bias voltage and for transmitting a corresponding current through its drain, and having its gate connected to the gates of said common gated p-type enhancement transistors, and further having as input to its gate said oscillator bias voltage, and having its source connected to said power source; and an initial n-type enhancement mode transistor having a gate, a source, and a drain for mirroring said corresponding current, and having its gate connected to its own drain and to the gates of said n-type enhancement mode transistors having common gates, and having its drain further connected to the drain of said initial p-type transistor, and its source connected to ground.

26. The apparatus of claim 23 wherein said charge pump comprises:

a first inverter (240) for inverting the output of said voltage-controlled oscillator, having an input connected to the output of said voltage-controlled oscillator;

an antiphase loop conductor connected to the output of said first inverter;

a second inverter (250) for inverting the output of said first inverter, having an input connected to the output of said first inverter;

a first n-channel capacitor (260) having a first terminal connected to the output of said second inverter and having a second terminal;

a first n-type enhancement mode transistor (213) having a gate, a source and a drain and said drain connected to the substrate of the semiconductor device and to its own said gate, and its said source connected to said second terminal of said first capacitor;

a p-type enhancement mode transistor (215) having a gate, a source and a drain, said source connected to the source of said first n-type transistor and to the second terminal of said first capacitor;

a conductor (222) for transmitting said regulating voltage from said sensor;

a first n-type depletion mode transistor (217) having a gate, a source and a drain, said drain connected to the drain of said p-type enhancement mode transistor, said source connected to ground, and said gate connected to said regulating voltage conductor;

a second n-type depletion mode transistor (219) having a gate, a source and a drain, said gate connected to said first n-type depletion mode transistor and to said regulating voltage conductor, and said source connected to ground;

an n-type enhancement mode transistor (221) having a gate, a source and a drain, said source connected to the drain of said second n-type depletion mode transistor, and said drain connected to said gate;

a second n-type enhancement mode transistor (223) having a gate, a source and a drain, said drain connected to the substrate of the semiconductor device and to said gate;

a second n-channel capacitor (270) having a first terminal connected to said antiphase loop conductor; and a node (D) having connections to the gate of said p-type enhancement mode transistor (215), to the drain of said n-type enhancement mode transistor (221), to the source of said second n-type enhancement mode diode transistor, and to a second terminal of said second n-channel capacitor (270).

27. The apparatus of claim 23 wherein said semiconductor device is an electrically erasable programmable read-only memory (EEPROM).

* * * * *